(12) United States Patent
Nittoor

(10) Patent No.: US 12,519,488 B2
(45) Date of Patent: Jan. 6, 2026

(54) SYSTEM AND METHOD FOR GENERATION OF ERROR-CORRECTING CODES IN COMMUNICATION SYSTEMS

(71) Applicant: Vivek Sathyanarayana Nittoor, Calgary (CA)

(72) Inventor: Vivek Sathyanarayana Nittoor, Calgary (CA)

( * ) Notice: Subject to any disclaimer, the term of this patent is extended or adjusted under 35 U.S.C. 154(b) by 135 days.

(21) Appl. No.: 18/594,222

(22) Filed: Mar. 4, 2024

(65) Prior Publication Data

US 2024/0223212 A1    Jul. 4, 2024

Related U.S. Application Data

(63) Continuation-in-part of application No. 16/066,915, filed on Jun. 28, 2018, now Pat. No. 11,955,988, which is a continuation of application No. PCT/IN2016/000295, filed on Dec. 27, 2016.

(30) Foreign Application Priority Data

Dec. 28, 2015 (IN) .......................... 7003/CHE/2015

(51) Int. Cl.
*H03M 13/11* (2006.01)
*H03M 13/03* (2006.01)

(52) U.S. Cl.
CPC ..... *H03M 13/1102* (2013.01); *H03M 13/033* (2013.01)

(58) Field of Classification Search
CPC ............. H03M 13/1102; H03M 3/033; H03M 13/353; H03M 13/6508; H03M 13/036; H03M 13/6519
USPC ........................................................ 714/752
See application file for complete search history.

(56) References Cited

U.S. PATENT DOCUMENTS

| | | | |
|---|---|---|---|
| 11,689,223 B2 * | 6/2023 | Aspuru-Guzik .. | H03M 13/1575 714/752 |
| 2009/0241013 A1 * | 9/2009 | Roetteler ............. | H03M 13/19 714/752 |
| 2013/0238951 A1 * | 9/2013 | Guha ..................... | H04B 10/70 714/752 |

FOREIGN PATENT DOCUMENTS

CN        101242188 B  *  5/2011

* cited by examiner

*Primary Examiner* — Albert Decady
*Assistant Examiner* — Enam Ahmed
(74) *Attorney, Agent, or Firm* — GOUD1E,PLLC

(57) ABSTRACT

The present invention provide a system and method for generating a catalogue of graphs that acts as a source for error correcting codes. A D3 chord index notation is used to describe the graphs. A list of (3, g) Hamiltonian graphs for even girth g is created to satisfy the condition 6 g 16. Each of the lists is infinite and is used for creating LDPC codes of high quality. Furthermore, the embodiments herein generalizes the application scenario for usage of LDPC codes. The embodiments herein utilizes dynamically changing error-correction codes in wireless communication systems.

11 Claims, 9 Drawing Sheets

SYSTEM AND METHOD FOR GENERATION OF ERROR-CORRECTING CODES IN COMMUNICATION SYSTEMS

CROSS-REFERENCE TO RELATED APPLICATIONS

The embodiments herein claim the priority of the Indian Provisional Patent Application (PPA) filed on Dec. 28, 2015, with the serial number 7003/CHE/2015 and entitled, "A CATALOGUE OF (3, g) HAMILTONIAN BIPARTITE GRAPHS AS A SOURCE FOR ERROR-CORRECTION CODES", and a continuation in part (CIP) of the NON-PROVISIONAL PATENT APPLICATION (NPA) filed at THE UNITED STATES PATENT AND TRADEMARK OFFICE (USPTO) on Jun. 28, 2018, with the Ser. No. 16/066,915 and title, "SYSTEM AND METHOD FOR GENERATION OF ERROR-CORRECTING CODES IN COMMUNICATION SYSTEMS", and the contents of all the abovementioned applications are included entirely as reference herein.

BACKGROUND

Technical Field

The present invention is generally related to graph theory. The present invention is particularly related to the representation of graphs. The present invention is more particularly related to generating graphs as a source for error correction codes.

Description of the Related Art

In the field of mathematics and computer science, graph theory refers to the study of graphs. The study and the implementation of graphs are used in various fields including electrical engineering (communications networks and coding theory), computer science (algorithms and computations), biochemistry (genomics), and operation research (scheduling), and the like.

One of the important applications of the graph theory is in error correcting codes. Error-correcting codes are techniques that enable reliable delivery of digital data over unreliable communication channels. The communication channels are generally subject to channel noise, and thus errors are introduced during transmission from a source to a receiver. The error detection techniques allow detecting such errors, while error correction enables the reconstruction of the original data in many cases.

It is evident from the above discussion that the generation of error codes is necessary and important in the field of communication. There are a plurality of methods for generating error correction codes. One of the methods for generating error-connection codes is by using graph theory.

The conventional methods for generating error-correction codes-include using Low-Density Parity Check (LDPC) codes, Turbo Codes, and the like. However, the conventional method for generating error correction codes has difficulty in finding trivalent graphs of large girth. Further, the conventional methods have difficulty in creating new lists with the smallest known graph.

The prior art has difficulty of finding trivalent graphs of large girth beyond or outside a vertex-transitive class. For example, the (3, 14) vertex-transitive graph with a minimum order of 406 was found by Hoare in 1981 and described in Hoare 1983 and Biggs 1989, and it was only in 2002, that a (3,14) record graph with record graph with order 384 was found by Exoo 2002 outside the class of vertex-transitive graphs, using a sophisticated voltage graph construction technique. The present disclosure aims to solve this difficulty by generating source codes using (3, g) Hamiltonian bipartite graphs for even girth g.

The prior art fails to solve large number of non-isomorphic trivalent graphs for orders greater than 32.

Even though new-generation wireless networks deliver a huge amount of data throughput compared with previous-generation technologies, there continue to be issues around the variability of the kind of data service available. Some of the continuing challenges for wireless would be to improve data speeds for signal weak spots and to increase the number of subscribers without a proportional increase in infrastructure investment.

Hence, there is a need for a method and system for generating a catalog of graphs, which act as a source for error-correcting codes. Still further, there is a need for a method and system for providing an increased supply of a plurality of graphs of high girth. Still further, there is a need for a system and method for generating dynamically changing error-correction codes that can potentially be used across the entire range of wireless communication standards.

The above-mentioned shortcomings, disadvantages, and problems are addressed herein, and which will be understood by reading and studying the following specification.

OBJECTIVES OF THE EMBODIMENTS HEREIN

The various embodiments of the present invention provide a method and system for generating a catalogue of graphs that acts as a source for error correcting codes.

The primary object of the present invention is to develop a system and method for providing a catalog of (3, g) Hamiltonian Bipartite graphs as a source for error-correcting codes.

Another object of the present invention is to provide a system and method for generating a catalog of (3, g) graph for a girth g, which is used for the generation of the error-correction codes.

Yet another object of the present invention is to develop a system and method for providing a new source of a plurality of graphs that dramatically increases the supply of graphs of high girth (orders greater than 32).

Yet another object of the present invention is to develop a system and method for generating a catalog of graphs of various orders (number of vertices), which is further used to generate a catalog of Low-Density Parity Check (LDPC) codes for various parameters (examples of parameters include size of matrix, regular or irregular degree, girth and the like).

Yet another object of the present invention is to develop a system and method for generating a list of a plurality of non-isomorphic trivalent graphs for greater orders (orders greater than 32).

Yet another object of the present invention is to provide a system and method to ease the process of finding the trivalent graphs of large girth.

Yet another object of the present invention is to provide a system and method for generating a list of graphs including the smallest known (3, g) graphs.

Yet another object of the present invention is to provide a system and method for providing to analyse the resulting graph listing.

Yet another object of the present invention is to provide a system and method for generating Hamiltonian Bipartite graphs with a higher value of even girths greater than 16.

Yet another object of the present invention is to provide a system and method for generating Hamiltonian Bipartite graphs for various symmetry factors of b for orders of 2 m such that m is a multiple of b.

Yet another object of the present invention is to provide a system and method for generating dynamically changing error-correction codes.

Yet another object of the present invention is to provide dynamically changing error-correction codes that can be potentially used across the entire range of wireless communication standards.

These and other objects and advantages of the present invention will become readily apparent from the following detailed description taken in conjunction with the accompanying drawings.

SUMMARY

The following details present a simplified summary of the embodiments herein to provide a basic understanding of the several aspects of the embodiments herein. This summary is not an extensive overview of the embodiments herein. It is not intended to identify key/critical elements of the embodiments herein or to delineate the scope of the embodiments herein. Its sole purpose is to present the concepts of the embodiments herein in a simplified form as a prelude to the more detailed description that is presented later.

The other objects and advantages of the embodiments herein will become readily apparent from the following description taken in conjunction with the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

This Summary is provided to introduce a selection of concepts in a simplified form that is further described below in the Detailed Description. This Summary is not intended to identify key or essential features of the claimed subject matter, nor is it intended to be used as an aid in determining the scope of the claimed subject matter.

The various embodiments of the present invention provide a system and method for generating a catalogue of (3, g) Hamiltonian bipartite graphs as a source for error-correction codes. The error correction codes thus generated are implemented in communication systems and related contexts. The present invention generates a catalog of graphs of various orders (number of vertices) which is further used generate a catalog of LDPC (Low Density Parity Check) codes for various parameters. The various parameters include size of matrix, degree, girth, and the like (A parity check matrix is an r-row by n column binary matrix, where k=n−r. The percentage of 1's in the parity check matrix for a LDPC code is low). Thus, the present invention provides LDPC codes that correspond to graphs of high girth.

According to an embodiment of the present invention, the system provides a result on existence of a (3, g) Hamiltonian bipartite graph for each order for which (3, g) vertex-transitive graphs exist, whether bipartite or non-bipartite for chosen intervals of comparison for even girth until g=14. For comparison with vertex-transitive graphs, (3, 6) graphs until order 50, (3, 8) graphs until order 90, (3, 10) graphs until order 160, (3, 12) graphs until order 400 and (3, 14) graphs until order 1000 are analyzed. According to an embodiment of the present invention, the system provides detailed information on existence of (3, g) Hamiltonian bipartite graphs for each order, with symmetry factors for which graphs have been found, symmetry factors for which graphs have been proven not to exist, and symmetry factors for which the existence of the graph have been found to be inconclusive. This analysis for various symmetry factors for each order, displays the strength of generated list of (3, g) Hamiltonian bipartite graphs.

A D3 chord index notation is used to describe the graphs. The present disclosure lists a (3, g) Hamiltonian bipartite graphs for even a girth g, to satisfy the limitation of 6 g 16. According to an embodiment of the present invention, each of the lists is infinite. The created graphs are used for generating the LDPC codes of high quality.

According to an embodiment of the present invention, the list of (3, g) graphs for even girth g has graphs that are not-vertex transitive for many orders. The list is created even for the smallest known (3, g) graphs. Further, the generated list covers a class of graphs which are greater than vertex-transitive graph. According to an embodiment of the present invention, the appropriate graphs for the listing are identified such that (3, g) graph of minimum order within the class is also the smallest known (3, g) graph.

According to an embodiment of the present invention, at first, a list of (3, g) Hamiltonian bipartite graphs is generated for each order until (3, g) Hamiltonian vertex-transitive graphs of order is generated. According to an embodiment of the present invention, a computation approach is used for finding and listing (3, g) Hamiltonian bipartite graphs for even a girth g over a wide range of orders until, and hence a (3,g) Hamiltonian bipartite graph with the minimum order is found.

According to an embodiment of the present invention, the catalogs are generated for Hamiltonian Bipartite graphs of even orders and regular degrees while the catalogues of LDPC codes are generated for both the regular and irregular degrees.

According to an embodiment of the present invention, a system and method are provided for generating Hamiltonian Bipartite graphs with a higher value of even girths greater than 16.

According to an embodiment of the present invention, a system and method are provided for generating Hamiltonian Bipartite graphs for various symmetry factors of b for orders of m such that is a multiple of b.

According to one embodiment herein, a system for generating dynamically changing error-correcting codes in communication systems is provided. The system comprises a cloud server configured to create a catalog of graphs and a catalog of LDPC codes. The cloud server is also configured to characterize the suitable LDPC code for each of a plurality of micro-channel conditions, code rate, number of input bits, and number of output bits. Further, the system comprises a base station or wireless router configured to obtain a plurality of information for each of a connected plurality of wireless devices or mobile handset. The base station or wireless router is further configured to send the plurality of information to the cloud server, and receive a list of optimal LDPC codes with specified code rate, number of input bits, and number of output bits for each of the plurality of micro-channel conditions of the connected each of the plurality of wireless devices or mobile handset. In addition, the base station or wireless router is also configured to negotiate or identify or select the suitable or suitable LDPC code to be used for communicating with each of the connected plurality of wireless devices or mobile handsets, and configured to switch to the suitable LDPC code if the plurality of wireless devices or mobile handsets agrees. Furthermore, the system comprises a plurality of wireless devices or mobile handsets comprising a baseband chipset, an application, and optionally an application-specific integration circuit (ASIC). The plurality of wireless devices or mobile handsets is further configured to bypass the error correction decoding on the baseband chipset and allow software LDPC decoding. The plurality of wireless devices or mobile handsets comprising optionally ASIC is configured to allow LDPC decoding in hardware for a variable range of code rates, number of input bits, and number of output bits. Moreover, the cloud server is further configured to receive the plurality of micro-channel conditions, code rate, number of input bits, and number of output bits for each of the plurality of wireless devices or mobile handsets connected to the base station or wireless router which is configured to implement dynamically changing error-correction codes. In some cases, the base station or wireless router may not implement dynamically changing error-correction codes. The cloud server is further configured to find the suitable LDPC code corresponding to each of the plurality of micro-channel conditions with specified code rate, number of input bits, and number of output bits. In addition, the cloud server is configured to send the suitable LDPC codes to the base station or wireless router and further configured to negotiate/identify or select the suitable or suitable LDPC code to be used between the plurality of wireless devices or mobile handsets.

According to one embodiment herein, the plurality of information for each of the connected plurality of wireless devices or mobile handsets includes micro-channel conditions, code rate, number of input bits, and number of output bits. Furthermore, the dynamically changing error-correction codes are the change of the error-correcting code of specified code rate, number of input bits, and number of output bits used at regular intervals of time based on the changing micro-channel conditions.

According to one embodiment herein, the method of interaction between the cloud server and the base station or wireless router is provided. The base station or wireless router uses channel estimation techniques to obtain information about each connected plurality of wireless devices or mobile handsets. The method involves sending the plurality of information comprising a list of micro-channel conditions, code rate, number of input bits, and number of output bits by the base station or wireless router for each of the connected plurality of wireless devices or mobile handsets to the cloud server. The method further involves sending the suitable LDPC codes of the required code rate, number of input bits, and number of output bits for each micro-channel conditions, by the cloud server to the base station or wireless router. Further, the method involves negotiating the suitable error-correction codes by the base station or wireless router on the suitable LDPC code with specified code rate, number of input bits, and number of output bits sent by the cloud server for each of the plurality of wireless devices or mobile handsets. These steps are repeated for a predetermined interval of time.

According to one embodiment herein, the negotiation between the base station or wireless router implementing dynamically changing error-correction codes and the plurality of wireless devices or mobile handsets is provided. For each of the connected plurality of wireless devices or mobile handsets, the base station or wireless router estimates the micro-channel instance by a combination of response to send pilot signal and machine learning techniques. The base station or wireless router obtains the suitable LDPC code of the required code rate, number of input bits, and number of output bits for that micro-channel instance from the cloud server. Further, the negotiation of the suitable LDPC code of the required code rate, number of input bits, and number of output bits for that micro-channel instance with each of the plurality of wireless devices or mobile handsets connected to it. Furthermore, the method of negotiation involves switching to a new LDPC code from the existing LDPC code, provided the plurality of wireless devices or mobile handsets agrees to it. Further, refusing to switch to the new LDPC code by the plurality of wireless devices or mobile handsets, if a sample decoding for the new LDPC code concludes that the computational resources available for decoding are insufficient and repeating the process at regular intervals of time to ensure that the most optimal LDPC code is available for each of the plurality of micro-channel conditions. Hence, if both the wireless router or the base station and the wireless device or mobile handset agree to switch to the new optimal LDPC code, then the new LDPC code has the same code rate, number of input bits, and number of output bits as the old error-correction code used.

According to one embodiment herein, the method of interaction between the cloud server and the base station or wireless router, which fails to incorporate dynamically changing error codes is provided. The wireless router or base station uses channel estimation techniques to obtain information about each connected plurality of wireless devices or mobile handsets. The wireless router or the base station or wireless router sends a list of micro-channel conditions, required code rate, number of input bits, and number of output bits for each connected wireless device or mobile handset to the cloud server. Further, the cloud server sends the list of suitable LDPC codes for each of the plurality of micro-channel conditions with specified code rate, number of input bits, and number of output bits for each wireless device or mobile handset to the wireless router or base station. In addition, the cloud server sends the list of suitable LDPC codes with specified code rates, number of input bits, and number of output bits for each of the micro-channel conditions for each wireless device or mobile handset to the application running on that particular device through the internet. Further, negotiating the suitable error-correction codes by the base station or wireless router on the suitable LDPC code with specified code rate, number of input bits, and number of output bits sent by the cloud server for each of the plurality of wireless devices or mobile handsets and switching to a new optimal LDPC code, provided the base station or wireless router and each of the connected plurality of wireless device or mobile handset agrees. In addition, the plurality of wireless devices or mobile handsets can refuse to switch to the new LDPC code if a sample decoding for the new LDPC concludes that the computational resources available for decoding are insufficient. Further, repeating the process for a predetermined interval of time.

According to one embodiment herein, the method of interaction between the base station or wireless router, which fails to incorporate dynamically changing error codes and the plurality of wireless devices or mobile handsets is provided. For the plurality of wireless devices or mobile handsets in range, the base station or wireless router estimates the micro-channel instance by a combination of response to send pilot signal and machine learning techniques and also obtains information about code rate, number of input bits and number of output bits. The base station or wireless router obtains the suitable LDPC code with specified code rate, number of input bits and number of output bits for that micro-channel instance from the cloud server. Further, negotiating the suitable LDPC code with specified code rate, number of input bits, and number of output bits for each of the plurality of micro-channel conditions for communication of each of the plurality of wireless devices or mobile handsets connected to a base station or wireless router. In addition, switching to the new optimal LDPC code, provided the base station or wireless router and each of the connected plurality of wireless device or mobile handsets agrees. Hence, the process is repeated at regular intervals thus ensuring that the LDPC code is always the most optimal one for the underlying channel conditions. Hence in the base station or wireless router without incorporating the dynamically changing error-correction codes, the cloud server is involved in this negotiation. The cloud server sends the optimal LDPC code to the application running on the plurality of wireless devices or mobile handsets through the internet. Therefore, if both the wireless router or the base station and the wireless device or mobile handset agree to switch to the new optimal LDPC code, then the new LDPC code has the same code rate, number of input bits, and number of output bits as the old error correction code used.

According to one embodiment herein, the plurality of wireless devices or mobile handsets comprising the application and ASIC, the LDPC decoding occurs either in the application or in the ASIC. The negotiated/identified/selected LDPC code might not be adopted in some cases if the software or application on the handset or the plurality of wireless devices or mobile handsets choose not to switch to the new LDPC code. Furthermore, considering the decoding complexity of the LDPC code might be unfeasible for the available computational resources for the wireless device or mobile handset. The wireless device or mobile handset can refuse to switch to the new LDPC code if the outcome of the sample decoding suggests that the available computational resources are insufficient.

According to one embodiment herein, a method for generating dynamically changing error-correcting codes in communication systems is provided. The method involves receiving a plurality of information for each of a plurality of wireless devices or mobile handsets connected to a base station or wireless router by a cloud server. The plurality of information for each of the connected plurality of wireless devices or mobile handsets includes micro-channel conditions, code rate, number of input bits, and number of output bits. The base station or wireless router may choose to implement or not implement dynamically changing codes. The method further involves creating a catalog of graphs, creating a catalog of LDPC codes, and characterizing the suitable LDPC code for each of a plurality of micro-channel conditions, code rate, number of input bits, and number of output bits. In addition, the method involves finding the suitable LDPC code corresponding to each of the plurality of micro-channel conditions with specified code rate, number of input bits, and number of output bits. The method further involves sending the suitable LDPC codes to the base station or wireless router and negotiating the suitable LDPC code to be used for each of the wireless devices or mobile handsets and switching to the suitable LDPC code for a particular wireless devices or mobile handset only after it agrees to switch.

The foregoing summary is illustrative only and is not intended to be in any way limiting. In addition to the illustrative aspects, embodiments, and features described above, further aspects, embodiments, and features will become apparent by reference to the drawings and the following detailed description.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The other objects, features and advantages will occur to those skilled in the art from the following description of the preferred embodiment and the accompanying drawings in which.

Figure 1:
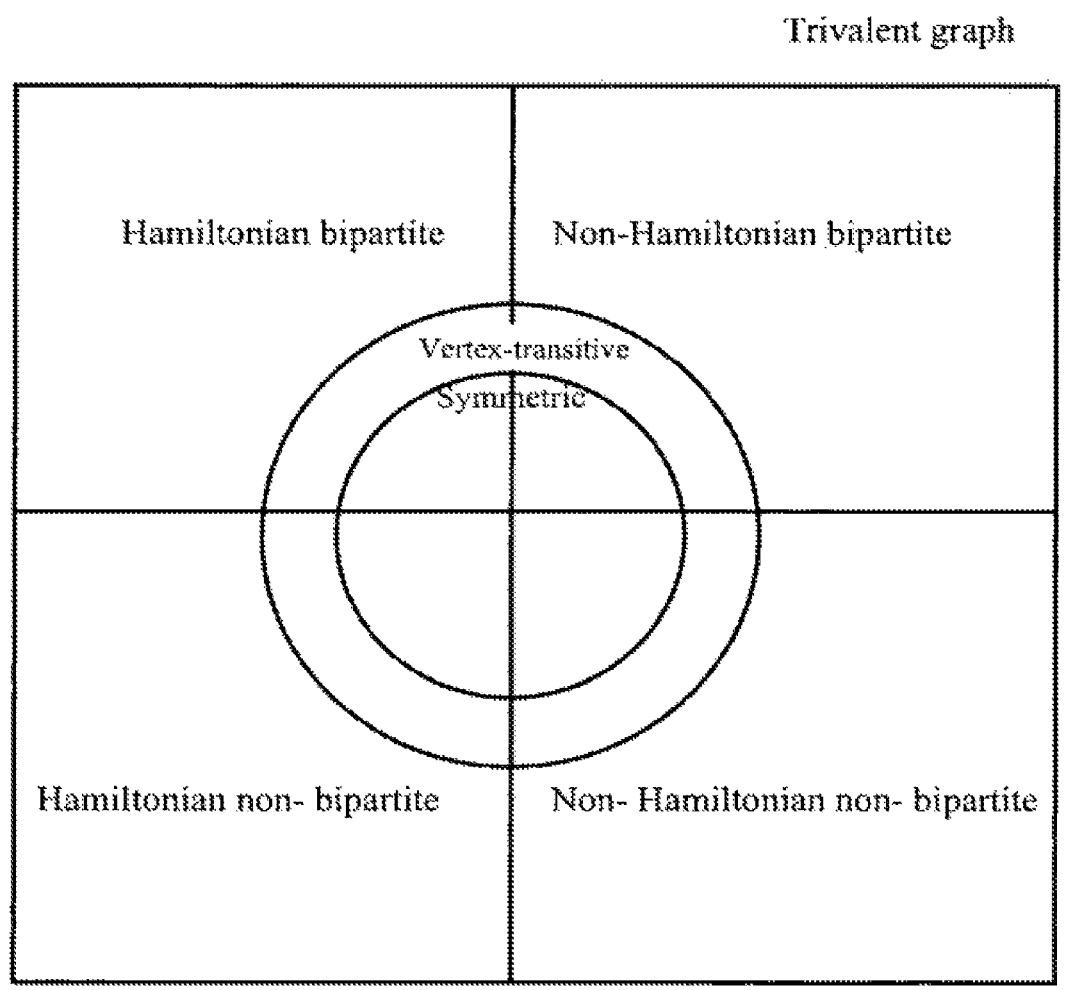
FIG. 1 illustrates a general Hamiltonian bipartite graph of minimum order for even girth g, according to one embodiment of the present invention.

Although the specific features of the present invention are shown in some drawings and not in others. This is done for convenience only as each feature may be combined with any or all of the other features in accordance with the present invention.

DETAILED DESCRIPTION OF THE EMBODIMENTS HEREIN

In the following detailed description, reference is made to the accompanying drawings that form a part hereof, and in which the specific embodiments that may be practiced is shown by way of illustration. These embodiments are described in sufficient detail to enable those skilled in the art to practice the embodiments and it is to be understood that the logical, mechanical, and other changes may be made without departing from the scope of the embodiments. The following detailed description is therefore not to be taken in a limiting sense.

The foregoing of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments.

The accompanying drawings are used to help easily understand various technical features and it should be understood that the embodiments presented herein are not limited by the accompanying drawings. As such, the present disclosure should be construed to extend to any alterations, equivalents, and substitutes in addition to those which are particularly set out in the accompanying drawings. Although the terms first, second, etc. may be used herein to describe various elements, these elements should not be limited by these terms. These terms are generally only used to distinguish one element from another.

The various embodiments of the present invention provide a method and system for generating a catalogue of graphs that acts as a source for error correcting codes.

A D3 chord index notation is used to describe the graphs. The present disclosure lists a (3, g) Hamiltonian bipartite graphs for even girth g, satisfying the condition 6 g 16. According to an embodiment of the present invention, each list is infinite. The graphs created is used for creating the LDPC codes of high quality.

According to an embodiment of the present invention, the created are used for generating a large number of non-isomorphic trivalent graphs for orders greater than 32.

According to an embodiment of the present invention, a new list of (3, g) graphs for even a girth g is generated to provide graphs that are not vertex transitive for many orders.

According to an embodiment of the present invention, a list of the smallest known (3, g) graphs. is created. Further, the created list covers a class of graphs wider than vertex-transitive graph. According to an embodiment of the present invention, the appropriate graphs for the list are identified such that (3, g) graph of minimum order within the class is also defined as the smallest known (3, g) graph.

TABLE 1

Values of minimum order of Cayley and vertex-transitive graphs for even values of g ≥ 6 obtained from Potocnik P., Spiga P., and Verret G. Cubic vertex-transitive graphs on up to 1280 vertices. arXiv:1201.5317v1 [math.CO], and Potocnik P., Spiga P., and Verret G. Bounding the order of the vertex stabiliser in 3-valent vertex-transitive and 4-valent arc-transitive graphs. arXiv:1010.2546v1 [math.CO], and lower and upper bounds obtained from Exoo G. and Jajcay R. Dynamic cage survey. Electronic Journal of Combinatorics, 18(DS16), 2011.

| Girth g | $n_{Cayley}$ | $n_{Vertex\_transitive}$ | (3, g) Lower Bound | (3, g) Upper Bound |
|---|---|---|---|---|
| 6 | 14 | 14 | 14 | 14 |
| 8 | 30 | 30 | 30 | 30 |
| 10 | 96 | 80 | 70 | 70 |
| 12 | 162 | 162 | 126 | 126 |
| 14 | 406 | 406 | 258 | 384 |
| 16 | 1008 | 1008 | 512 | 960 |

According to an embodiment of the present invention, a list of the graphs with higher orders and larger girths than that in the exiting list is created with the graphs of several orders that lie outside the vertex-transitive class. According to an embodiment of the present invention, a plurality of subclasses is defined and a list one representative graph from each subclass (if the subclass is not empty) to enumerate all non-isomorphic graphs.

According to an embodiment of the present invention, the graphs and the subclasses are defined for developing a practical algorithm for generating the graphs.

According to an embodiment of the present invention, a resulting graph list is analysed. The analysis is a dynamic and continuous process to provide a knowledge and methods in extremal graph theory.

According to an embodiment of the present invention, every (3, g) Hamiltonian bipartite graph of minimum order is also (3, g) cage for even girth g 12 Hamiltonian trivalent bipartite graphs represent one quadrant in the space of trivalent graphs as illustrated in the FIG. 1. According to an embodiment of the present invention, the other three quadrants are the Hamiltonian non-bipartite graphs, the non-Hamiltonian bipartite graphs and the non-Hamiltonian non-bipartite graphs. According to an embodiment of the present invention, there are no known enumeration methods for trivalent graphs outside the set of vertex-transitive graphs.

According to an embodiment of the present invention, a list of (3, g) Hamiltonian bipartite graphs for each order is generated to have (3, g) Hamiltonian vertex-transitive graphs. of several orders. According to an embodiment of the present invention, a computation approach is used for finding and listing (3, g) Hamiltonian bipartite graphs for even a girth g over a range of orders, and hence a (3,g) Hamiltonian bipartite graph with the minimum order is found.

According to an embodiment of the present invention, the outcome of the listing of (3, g) Hamiltonian bipartite graphs of orders is as follows:

An exhaustive list is generated to cover all orders in a specified range that have a (3, g) Hamiltonian bipartite graph, with a proof for non-existence of graphs of the orders that are not listed.

A partial list results on an existence (3, g) Hamiltonian bipartite graph, for some orders in specified range are inconclusive.

According to an embodiment of the present invention, the notation D3 • refers to D3 chord indices {11, Ii, . . . lb) for a Hamiltonian trivalent bipartite graph with symmetry factor b and 2 m vertices where bjm.

TABLE 2

| Comparison of orders of (3, g) lists | | | | |
|---|---|---|---|---|
| (3, g) graphs | Until order | Hamiltonian Bipartite | Vertex-transitive | Symmetric |
| (3, 6) | 50 | 19 | 19 | 10 |
| (3, 8) | 90 | 29 | 21 | 6 |
| (3, 10) | 160 | 29 | 15 | 7 |
| (3, 12) | 400 | 84 | 26 | 16 |
| (3, 14) | 1000 | 164 | 35 | 11 |

According to an embodiment of the present invention, the Hamiltonian bipartite graphs are identified as a promising class of trivalent graphs that lead to a listing of (3, g) graphs for even a girth g and list of graphs includes graphs for more orders than that present in the existing list. Further the list is also expected to contain a (3, g) graph with minimum order. The present invention provides the first known work to list Hamiltonian bipartite graphs of specified even girths, and the first known enumeration method outside the class of trivalent vertex-transitive graphs such that the generated list has graphs for larger number of distinct orders than the that in the existing lists. Still further the generated list includes the (3, g) cage for g=6, 8, and 12, one (3, 10) cage and the (3, 14) record graph.

According to an embodiment of the present invention, the list has (3, g) graphs for more orders compared to the existing lists. The result on existence of a (3, g) vertex-transitive graphs exist, whether bipartite or non-bipartite for chosen intervals of comparison with vertex-transitive graphs, the (3, 6) graphs are considered until order 50, (3, 8) graphs until order 90, (3, 10) graphs until order 160, (3, 12) graphs until order 400 and (3, 14) graphs until order 1000.

According to an embodiment of the present invention, a detailed information on existence of (3, g) Hamiltonian bipartite graphs for each other, with symmetry factors for which graphs have been found, symmetry factors for which graphs have been proven not to exist, and symmetry factors for which the existence of the graph have been found to be inconclusive in the factor analysis tables. The present invention provides an analysis for various symmetry factors for each order show the strength of our list of (3, g) Hamiltonian bipartite graphs.

According to an embodiment of the present invention, a large number of (3, g) graphs are available outside the vertex-transitive class. There are many orders for which a (3, g) vertex-transitive graph does not exist, for which (3, g) Hamiltonian bipartite graph is provided in the present list.

According to an embodiment of the present invention, the present list of (3, g) Hamiltonian bipartite graphs are exhaustive with graphs for each order in specified range with proof of non-existence for orders of graphs not listed for g=6,8 and partial for 10, 12, 14, and 16 due to some inconclusive results for some subclasses.

According to an embodiment of the present invention, a symmetry factor for representing the level of rotational symmetry in Hamiltonian trivalent graphs. According to an embodiment of the present invention, the symmetry factor allows decomposing the problem of listing (3, g) Hamiltonian bipartite graphs of even girth g for a range of orders into sub-problems of listing (3, g) Hamiltonian bipartite graphs for a specified symmetry factor b for a range of orders, and hence allows listing of (3, g) Hamiltonian bipartite graphs for more orders.

According to an embodiment of the present invention, a D3 chord index notation, which is twice as compact as LCF notation for representing Hamiltonian trivalent bipartite graphs.

According to an embodiment of the present invention, the D3 chord index notation can specify an infinite family of Hamiltonian bipartite graphs, for different orders greater than a threshold value.

For example, the D3 chord index "5" leads to a (3, 6) Hamiltonian bipartite graph for all even orders greater than or equal to 14. This has been proved theoretically and practically verified until order 20008.

In another example, the D3 chord indices "15 53 73 139 243 267 4 71 651" leads to (3, 16) Hamiltonian bipartite graphs for orders 23 52+1 6i for integers i 0, for symmetry factor 8. In addition, it also observed that the above mentioned D3 chord indices also lead to (3, 16) Hamiltonian bipartite graphs for the orders 1824, 1840, 1936, 2016, 2032, 2112, 2144, 2160, 2176, 2240, 2256, 2272, 2288, 2304, and 2320.

According to an embodiment of the present invention, the list of graphs is generated to provide lower bounds and upper bounds on minimum order for the existence of a (3, g) Hamiltonian bipartite graph for a specified symmetry factor b for even girth g, with the lower bound being equal to the upper bound for a plurality of cases. For example, the corresponding lower bound and upper bounds are equal for symmetry factors 4, 5 and 6 for (3, 14) Hamiltonian bipartite graphs.

According to an embodiment of the present invention, a theoretical lower bound and empirical data for the minimum value of symmetry factor b is disclosed for a (3, g) Hamiltonian bipartite graph for a range of even girth g. For example, the minimum value of symmetry factor for (3, 6) Hamiltonian bipartite graphs is 1, and that for (3, 8) Hamiltonian bipartite graphs is 2.

According to an embodiment of the present invention, the results on non-existence of (3, g) Hamiltonian bipartite graphs for some orders and symmetry factors show that the emptiness of subclasses of graphs are of greater interest. For example, the lower bound is 258 and upper bound is 384 for (3, 14) graphs. It is shown the non-existence of (3, 14) Hamiltonian bipartite graphs between orders 258 and 384 for symmetry factors 4, 5, 6 and emptiness of many other subclasses. as per the non-existence list.

Figure 2:
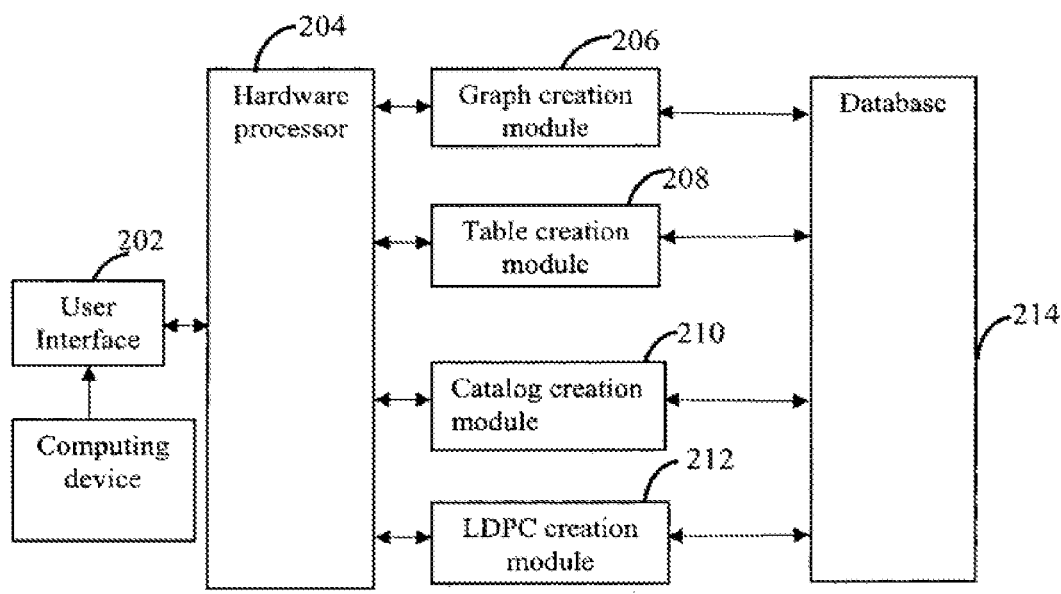
FIG. 2 illustrates a system for generating a catalog of graphs that acts as a source for error-correcting codes, in accordance with an embodiment of the present invention.

FIG. 2 illustrates a system for generating a catalogue of graphs that acts as a source for error correcting codes, in accordance with an embodiment of the present invention. The system generates a catalog of (3, g) graphs for even girth g. The catalog thus generated is used to generate error correction codes. The system generates a new source of graphs that dramatically increase the supply of graphs of high girth 3.

According to an embodiment of the present invention, D3 chord index notation are used to describe the graphs. The system lists a catalog of (3, g) Hamiltonian bipartite graphs for even girth g satisfying 6≤ g≤16. Each of these lists are infinite. The created graphs are used for generating the LDPC codes of high quality.

According to an embodiment of the present invention, the system includes the user interface 202, the hardware processor 204, the graph creation module 206, the table creation module 208, the catalog creation module 210, the LDPC creation module 212, and database 214.

The user interface 202 such as touch screen display or keyboard enables a user to enter required parameters such as girth, symmetry factor, matrix and the like. The input parameters are transmitted to the hardware processor 204. The hardware processor 204 is configured to generate a catalog of {3, g) graphs for even girth g and further generate error correction codes. The hardware processor 204 is configured to operate the graph creation module 206, the table creation module 208, the catalog creation module 210, and the LDPC creation module 212.

The graph creation module 206 is configured to estimate trivalent graphs of large girth that are not vertex-transitive. Further, the graph creation module 206 generates at least one (3, g) graph for each distinct order for even values of girth g. The graph creation module 206 is configured to generate smallest known (3, g) graph and graphs wider than vertex transitive graphs. Further, the graph creation module 206 generates graphs with larger number of orders and larger girths than the existing listings, with graphs outside the vertex transitive class for many orders. Further, the graph creation module 206 is configured to generate a list of (3, g) Hamiltonian bipartite graphs of specified even girth, outside the vertex-transitive class for many orders.

The table creation module 206 is configured to create a table of (3, g) Hamiltonian bipartite graphs for a symmetry factor b, for different orders. Tables of order (3, 6) to (3, 16) are generated. For example, tables of (3, 6) graphs until order 50, (3, 8) graphs until order 90, (3, 10) graphs until order 160, (3, 12) graphs until order 400 and (3, 14) graphs until order 1000. Thus, the tables include lists of (3, g) Hamiltonian bipartite graphs that are exhaustive with graphs for each order in specified range with proof of nonexistence for orders of graphs not listed for g=6, 8 and partial for 10, 12, 14, and 16 due to some inconclusive results for some subclasses.

Further, the catalog creation module 210 generates a catalog of (3, g) Hamiltonian bipartite graphs including a plurality of tables for various orders.

The LDPC creation module 212 generates a catalog of LDPC codes from a catalog of (3, g) Hamiltonian bipartite graphs.

Figure 3:
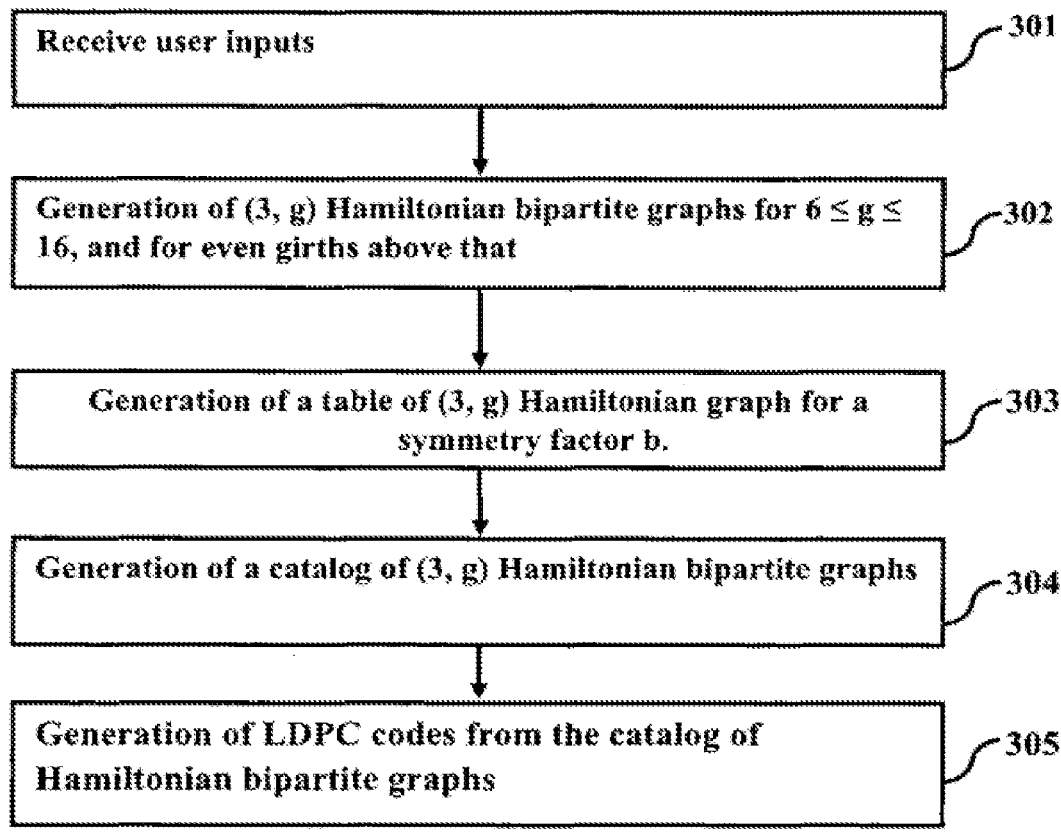
FIG. 3 is a flowchart illustrating a method for the generation of error correction codes, in accordance with an embodiment of the present invention.

FIG. 3 is a flowchart illustrating a method for generation of error correction codes, in accordance with an embodiment of the present invention.

According to an embodiment of the present invention, the method for generation of error correction codes includes receiving user input regarding graph parameters through a user interface on a computing device (301). Further, Hamiltonian bipartite graphs for girth size 6~g~16 is generated (302) through a graph generation module. Subsequently, at least one (3, g) graph for each distinct order for even values of girth g is generated. Also, the smallest known (3, g) graph and graphs wider than vertex transitive graphs is generated by the graph creation module. Graphs with larger number of orders and larger girths than the existing listings outside the vertex-transitive class for many orders is generated by the graph creation module.

According to an embodiment of the present invention, a table of (3, g) Hamiltonian graph for a symmetry factor is generated b (303). The tables include lists of (3, g) Hamiltonian bipartite graphs that are exhaustive with graphs for each order in specified range with proof of nonexistence for orders of graphs not listed for g=6, 8 and partial for 10, 12, 14, and 16 due to some inconclusive results for some subclasses.

Further, a catalog of (3, g) Hamiltonian bipartite graphs is generated (304). And a catalog of LDPC codes are generated from the catalog of Hamiltonian bipartite graphs. (305). Thus, the method includes generating a catalog of graphs of various orders (number of vertices) which is further used to generate a catalog of LDPC (Low Density Parity Check) codes for various parameters. The various parameters include size of matrix, degree, girth, and the like.

According to an embodiment of the present invention, the system provides a result on existence of a (3, g) Hamiltonian bipartite graph for each order for which (3, g) vertex-transitive graphs exist, whether bipartite or non-bipartite for chosen intervals of comparison for even girth until g=14. For comparison with vertex-transitive graphs, (3, 6) graphs until order 50, (3, 8) graphs until order 90, (3, 10) graphs until order 160, (3, 12) graphs until order 400 and (3, 14) graphs until order 1000 are analyzed. According to an embodiment of the present invention, the system provides detailed information, on existence of (3, g) Hamiltonian bipartite graphs for each order, with symmetry factors for which graphs have been found, symmetry factors for which graphs have been proven not to exist, and symmetry factors for which the existence of the graph have been found to be inconclusive in the factor analysis tables. This analysis for various symmetry factors for each order, displays the strength of generated list of (3, g) Hamiltonian bipartite graphs.

According to an embodiment of the present invention, the catalogues are generated for Hamiltonian Bipartite graphs of even orders and regular degree while the catalogues of LDPC codes are generated for both the regular and irregular degrees.

According to an embodiment of the present invention, a system and method are provided for generating Hamiltonian Bipartite graphs with a higher value of even girths greater than 16.

According to an embodiment of the present invention, a system and method are provided for generating Hamiltonian Bipartite graphs for various symmetry factors of b for orders of 2 m such that m is a multiple of b.

The foregoing description of. the specific embodiments will so fully reveal the general nature of the embodiments herein that others can, by applying current knowledge, readily modify and/or adapt for various applications such specific embodiments without departing ~om the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modifications.

The various embodiments of the present invention provide a method and system for generating a catalogue of graphs that acts as a source for error correcting codes.

The present invention provides a catalogue of (3, g) Hamiltonian Bipartite graphs as a source for error-correcting codes.

The present invention provides a system and method to generate a catalogue of (3, g) graph for even girth g, which is used for generation of the error-correction codes.

The present invention provides a new source of graphs that dramatically increases the supply of graphs of high girth.

The present invention provides a list a plurality of non-isomorphic trivalent graphs for greater orders such as orders greater than 32.

The present invention provides a system and method to ease the process of finding the trivalent graphs of large girth.

The present invention provides a listing of graphs including the smallest known (3, g) graphs.

The present invention provides a system and method to analyse the resulting graph list.

The present invention provides a system and method for generating Hamiltonian Bipartite graphs with a higher value of even girths greater than 16.

The present invention provides a system and method for generating Hamiltonian Bipartite graphs for various symmetry factors of b for orders of 2 m such that m is a multiple of b.

According to one embodiment herein, a system for generating dynamically changing error-correcting codes in communication systems is provided. The system comprises a cloud server configured to create a catalog of graphs and a catalog of LDPC codes. The cloud server is also configured to characterize the suitable LDPC code for each of a plurality of micro-channel conditions, code rate, number of input bits, and number of output bits. Further, the system comprises a base station or wireless router configured to obtain a plurality of information for each of a connected plurality of wireless devices or mobile handsets. The base station or wireless router is further configured to send the plurality of information to the cloud server, and receive a list of optimal LDPC codes with specified code rate, number of input bits, and number of output bits for each of the plurality of micro-channel conditions of the connected each of the plurality of wireless devices or mobile handsets. In addition, the base station or wireless router is also configured to negotiate/select/identify the suitable or suitable LDPC code with each of the connected plurality of wireless devices or mobile handsets, and configured to switch to the suitable LDPC code for a particular wireless device or mobile handset only if both agrees for the switch. Moreover, the base station or wireless router incorporates dynamically changing error correction into a wireless standard, to negotiate/select/identify the suitable LDPC code with each of the connected wireless device or mobile handset. Furthermore, the system comprises a plurality of wireless devices or mobile handsets comprising a baseband chipset, an application, and optionally an application-specific integration circuit (ASIC). The plurality of wireless devices or mobile handsets is further configured to bypass the error correction decoding on the baseband chipset and allow software LDPC decoding. The plurality of wireless devices or mobile handsets comprising optionally ASIC is configured to allow LDPC decoding in hardware for a variable range of code rates, number of input bits, and number of output bits. Moreover, the cloud server is further configured to receive the plurality of micro-channel conditions, code rate, number of input bits, and number of output bits for each of the plurality of wireless devices or mobile handsets connected to the base station or wireless router which is configured to implement dynamically changing error-correction codes. In some cases, the base station or wireless router may not implement dynamically changing error-correction codes. The cloud server is further configured to find the suitable LDPC code corresponding to each of the plurality of micro-channel conditions with specified code rate, number of input bits, and number of output bits. In addition, the cloud server is configured to send the suitable LDPC codes to the base station or wireless router and further configured to negotiate/select/identify the suitable LDPC code to be used by the base station or wireless router for each of the connected wireless device or mobile handset. Moreover, the cloud server is also configured to negotiate/identify or select the suitable LDPC code for communication of base station or wireless router with each connected wireless device or mobile handset when dynamically changing error-correction codes is used with an existing wireless standard.

According to one embodiment herein, the plurality of information for each of the connected plurality of wireless devices or mobile handsets includes micro-channel conditions, code rate, number of input bits, and number of output bits. Furthermore, the dynamically changing error-correction codes are the change of the error-correcting code of specified code rate, number of input bits, and number of output bits used at regular intervals of time based on the changing micro-channel conditions.

According to one embodiment herein, a catalog of LDPC codes is created from the catalog of graphs by the cloud server. For instance, assume the techniques $T\_1, T\_2, \ldots, T\_n$ for generating a LDPC code from a graph of high girth.

For (each graph G of high girth from the catalog of graphs)

{Enumerate all connected subgraphs $H\_x$ of G For (all $H\_x$) { for($1 <= i <= n$) { Apply $T\_i$ to graph Hx to obtain LDPC code $T\_i,x(G)$}}}

Therefore, all connected subgraphs are enumerated, since irregular connected graphs of high girth are known to be useful for generating LDPC codes. Hence, the exhaustive catalog consists of LDPC codes of different code rates, the corresponding number of input bits, and the number of output bits. For example, code rate ⅓, number of input bits is 128, and number of output bits is 384.

Correspondingly, while the characterization of the suitable LDPC codes, let us assume a finite set of channel conditions $C\_1, C\_2, \ldots, C\_m$. Some examples of generic channel conditions are Additive White Gaussian noise (AWGN), Rayleigh fading, and Rician fading channels. For each list of generic channel conditions, a finite number of variations of parameters $P\_1, P\_2, \ldots, P\_l$ are created.

for ($1<=p<=m$) {for ($1<=q<=l$) {for (each LDPC code $T\_\{i,x\}$ (G) in catalog of LDPC codes) {Simulate the performance $s(T\_\{i, x\}$ (G), $C\_p, P\_q$) and obtain BER (bit error rate) performance}

Identify suitable LDPC code $T\_\{i, x, p, q\}$ for channel condition based on lowest BER (bit error rate) performance with required code rate, number of input bits and number of output bits}}

Simulation of the performance of LDPC codes for a particular channel condition $s(T\_\{i, x\}$ (G), $C\_p, P\_q$).

According to one embodiment herein, the method of interaction between the cloud server and the base station or wireless router is provided. The base station or wireless router uses channel estimation techniques to obtain information about each connected plurality of wireless devices or mobile handsets. The method involves sending the plurality of information comprising a list of micro-channel conditions, code rate, number of input bits, and number of output bits by the base station or wireless router for each of the connected plurality of wireless devices or mobile handsets to the cloud server. The method further involves sending the suitable LDPC codes of the required code rate, number of input bits, and number of output bits for each micro-channel conditions, by the cloud server to the base station or wireless router. Further, the method involves negotiating the suitable error-correction codes by the base station or wireless router on the suitable LDPC code with specified code rate, number of input bits, and number of output bits sent by the cloud server for each of the plurality of wireless devices or mobile handset. These steps are repeated for a predetermined interval of time.

According to one embodiment herein, the negotiation between the base station or wireless router implementing dynamically changing error-correction codes and the plurality of wireless devices or mobile handsets is provided. For each of the connected plurality of wireless devices or mobile handsets, the base station or wireless router estimates the micro-channel instance by a combination of response to send pilot signal and machine learning techniques. The base station or wireless router obtains the suitable LDPC code of the required code rate, number of input bits, and number of output bits for that micro-channel instance from the cloud server. Further, the negotiation of the suitable LDPC code of the required code rate, number of input bits, and number of output bits for that micro-channel instance with each of the plurality of wireless devices or mobile handsets connected to it. Furthermore, the method of negotiation involves switching to a new LDPC code from the existing LDPC code, provided the plurality of wireless devices or mobile handsets agrees to it. Further, refusing to switch to the new LDPC code by the plurality of wireless devices or mobile handsets, if a sample decoding for the new LDPC code concludes that the computational resources available for decoding are insufficient and repeating the process at regular intervals of time to ensure that the most optimal LDPC code is available for each of the plurality of micro-channel conditions. Hence, if both the wireless router or the base station and the wireless device or mobile handsets agree to switch to the new optimal LDPC code, then the new LDPC code has the same code rate, number of input bits, and number of output bits as the old error-correction code used.

According to one embodiment herein, the method of interaction between the cloud server and the base station or wireless router, which fails to incorporate dynamically changing error codes is provided. The wireless router or base station uses channel estimation techniques to obtain information about each connected plurality of wireless devices or mobile handsets. The wireless router or the base station sends a list of micro-channel conditions, required code rate, number of input bits, and number of output bits for each connected wireless device or mobile handset to the cloud server. Further, the cloud server sends the list of suitable LDPC codes for each of the plurality of micro-channel conditions with specified code rate, number of input bits, and number of output bits for each wireless device or mobile handset to the wireless router or base station. In addition, the cloud server sends the list of suitable LDPC codes with specified code rates, number of input bits, and number of output bits for each of the micro-channel conditions for each wireless device or mobile handset to the application running on that particular device through the internet. Further, negotiating the suitable error-correction codes by the base station or wireless router on the suitable LDPC code with specified code rate, number of input bits, and number of output bits sent by the cloud server for each of the plurality of wireless devices or mobile handsets and switching to a new optimal LDPC code, provided the base station or wireless router and each of the connected plurality of wireless device or mobile handset agrees. In addition, a particular wireless device or mobile handset can refuse to switch to the new LDPC code if a sample decoding for the new LDPC concludes that the computational resources available for decoding are insufficient. Further, repeating the process for a predetermined interval of time.

According to one embodiment herein, the method of interaction between the base station or wireless router, which fails to incorporate dynamically changing error codes and the plurality of wireless devices or mobile handsets is provided. For the plurality of wireless devices or mobile handsets in range, the base station or wireless router estimates the micro-channel instance by a combination of response to send pilot signal and machine learning techniques and also obtains information about code rate, number of input bits and number of output bits. The base station or wireless router obtains the suitable LDPC code with specified code rate, number of input bits and number of output bits for that micro-channel instance from the cloud server. Further, negotiating the suitable LDPC code with specified code rate, number of input bits, and number of output bits for each of the plurality of micro-channel conditions for communication of each of the plurality of wireless devices or mobile handsets connected to a base station or wireless router. In addition, switching to the new optimal LDPC code, provided the base station or wireless router and each of the connected plurality of wireless device or mobile handsets agrees. Hence, the process is repeated at regular intervals thus ensuring that the LDPC code is always the most optimal one for the underlying channel conditions. Hence in the base station or wireless router without incorporating the dynamically changing error-correction codes, the cloud server is involved in this negotiation. The cloud server sends the optimal LDPC code to the application running on the plurality of wireless devices or mobile handsets through the internet. Therefore, if both the wireless router or the base station and the wireless device or mobile handset agree to switch to the new optimal LDPC code, then the new LDPC code has the same code rate, number of input bits and number of output bits as the old error correction code used.

According to one embodiment herein, the plurality of wireless devices or mobile handsets comprising the application and ASIC, the LDPC decoding occurs either in the application or in the ASIC. The negotiated/identified or selected LDPC code might not be adopted in some cases if the software or application on the handset or the plurality of wireless devices or mobile handsets choose not to switch to the new LDPC code. Furthermore, considering the decoding complexity of the LDPC code might be unfeasible for the available computational resources for the wireless device or mobile handset. The particular wireless device or mobile handset can refuse to switch to the new LDPC code if the outcome of the sample decoding suggests that the available computational resources are insufficient.

According to one embodiment herein, a method for generating dynamically changing error-correcting codes in communication systems is provided. The method involves receiving a plurality of information for each of a plurality of wireless devices or mobile handsets connected to a base station or wireless router by a cloud server. The plurality of information for each of the connected plurality of wireless devices or mobile handsets includes micro-channel conditions, code rate, number of input bits, and number of output bits. The base station or wireless router may choose to implement or not implement dynamically changing codes. The method further involves creating a catalog of graphs, creating a catalog of LDPC codes, and characterizing the suitable LDPC code for each of a plurality of micro-channel conditions, code rate, number of input bits, and number of output bits. In addition, the method involves finding the suitable LDPC code corresponding to each of the plurality of micro-channel conditions with specified code rate, number of input bits, and number of output bits. The method further involves sending the suitable LDPC codes by the cloud server to the base station or wireless router for each connected wireless devices or mobile handsets and negotiating the suitable LDPC code to be used between the base station or wireless router and each of the connected wireless device or mobile handset, such that the both agrees.

Figure 4:
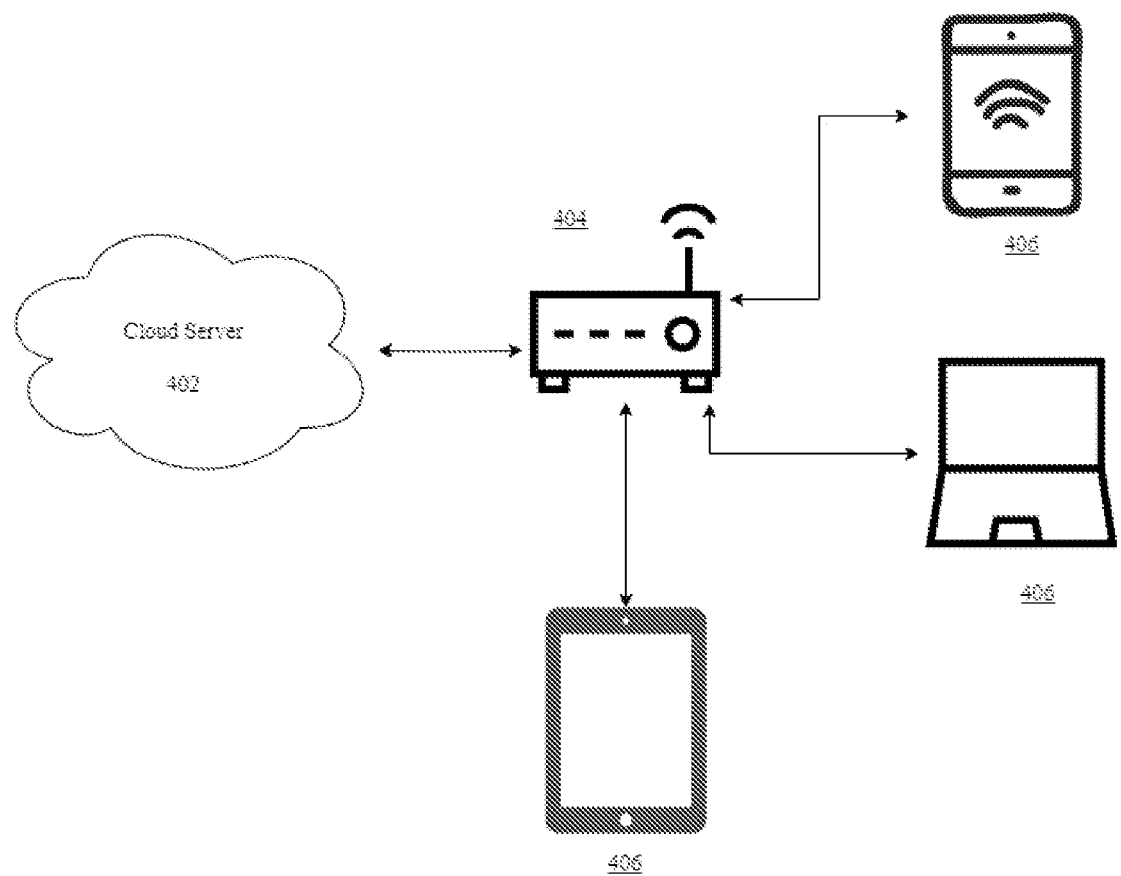
FIG. 4 illustrates an exemplary block diagram of a system for generating dynamically changing error-correcting codes in communication systems, according to an embodiment herein.

FIG. 4 illustrates an exemplary block diagram of a system for generating dynamically changing error-correcting codes in communication systems, according to an embodiment herein. The system 400 comprises a cloud server 402 configured to create a catalog of graphs and a catalog of LDPC codes. The cloud server 402 is also configured to characterize the suitable LDPC code for each of a plurality of micro-channel conditions, code rate, number of input bits, and number of output bits. Further, the system 400 comprises a base station or wireless router 404 configured to obtain a plurality of information for each of a connected plurality of wireless devices or mobile handsets. The base station or wireless router 404 is further configured to send the plurality of information to the cloud server 402, and receive a list of optimal LDPC codes with specified code rate, number of input bits, and number of output bits for each of the plurality of micro-channel conditions of the connected each of the plurality of wireless devices or mobile handsets. In addition, the base station or wireless router 404 is also configured to negotiate/identify or select the suitable LDPC code with each of the connected plurality of wireless devices or mobile handsets, and configured to switch to the suitable LDPC code if the particular wireless device or mobile handset agrees. The base station or wireless router 404 also incorporates dynamically changing error correction into a wireless standard, to negotiate/identify or select the suitable LDPC code with each of the connected wireless devices or mobile handsets 406. Furthermore, the system comprises a plurality of wireless devices or mobile handsets 406 comprising a baseband chipset, an application, and optionally an application-specific integration circuit (ASIC). The plurality of wireless devices or mobile handsets 406 is further configured to bypass the error correction decoding on the baseband chipset and allow software LDPC decoding. The plurality of wireless devices or mobile handsets 406 comprising optionally ASIC is configured to allow LDPC decoding in hardware for a variable range of code rates, number of input bits, and number of output bits. Moreover, the cloud server 402 is further configured to receive the plurality of micro-channel conditions, code rate, number of input bits, and number of output bits for each of the plurality of wireless devices or mobile handsets connected to the base station or wireless router 404 which is configured to implement dynamically changing error-correction codes. In some cases, the base station or wireless router 404 may not implement dynamically changing error-correction codes. The cloud server 402 is further configured to find the suitable LDPC code corresponding to each of the plurality of micro-channel conditions with specified code rate, number of input bits, and number of output bits. In addition, the cloud server 402 is configured to send the suitable LDPC codes to the base station or wireless router 404 and further configured to negotiate/identify or select the suitable LDPC code to be used for communication with each wireless device or mobile handset 406.

Figure 5:
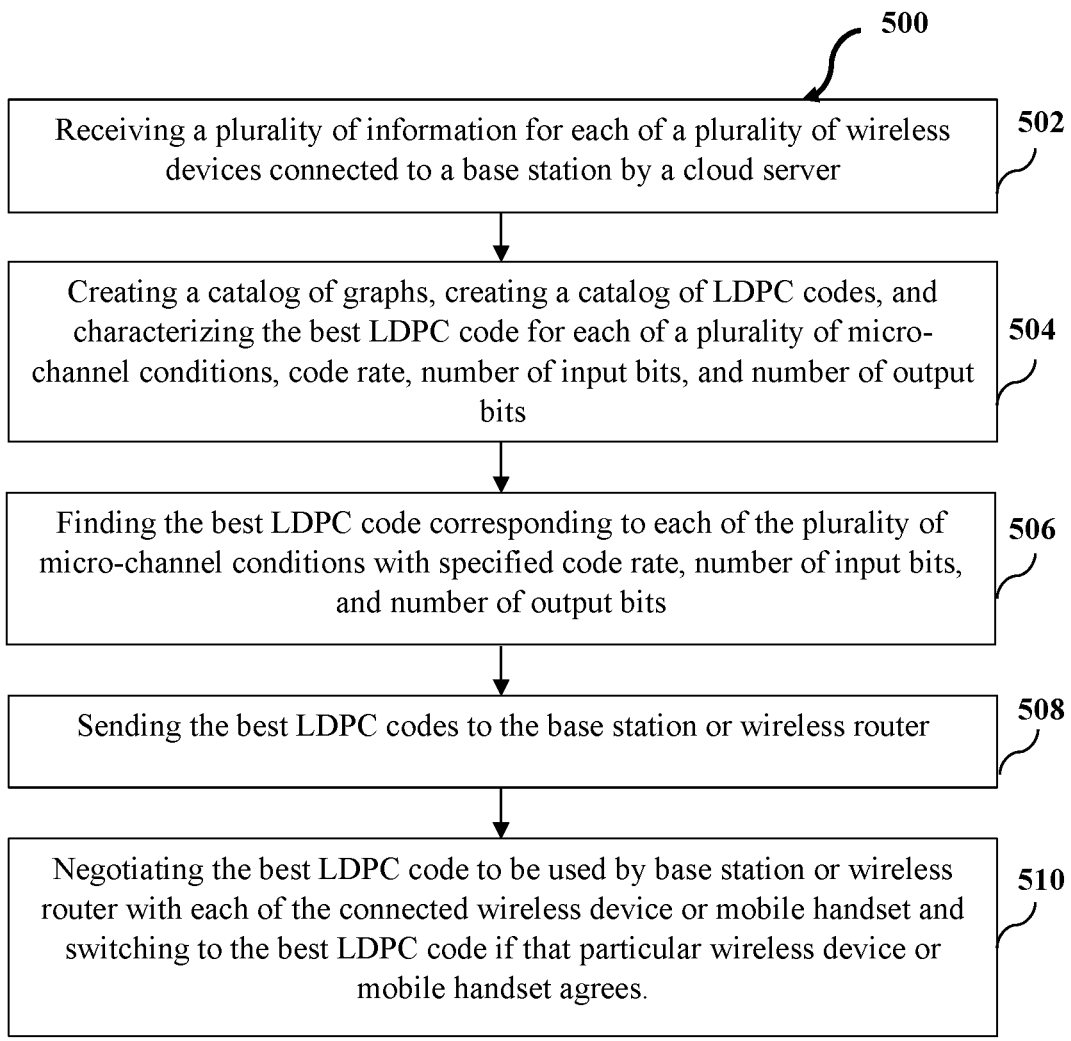
FIG. 5 illustrates a flowchart on a method for generating dynamically changing error-correcting codes in communication systems, according to an embodiment herein.

FIG. 5 illustrates a flowchart on a method for generating dynamically changing error-correcting codes in communication systems, according to an embodiment herein. The method 500 involves receiving a plurality of information for each of a plurality of wireless devices or mobile handsets connected to a base station or wireless router by a cloud server at step 502. The plurality of information for each of the connected plurality of wireless devices or mobile handsets includes micro-channel conditions, code rate, number of input bits, and number of output bits. The base station or wireless router may choose to implement or not implement dynamically changing codes. The method 500 further involves creating a catalog of graphs, creating a catalog of LDPC codes, and characterizing the suitable LDPC code for each of a plurality of micro-channel conditions, code rate, number of input bits, and number of output bits at step 504. In addition, the method 500 involves finding the suitable LDPC code corresponding to each of the plurality of micro-channel conditions with specified code rate, number of input bits, and number of output bits at step 506. The method 500 further involves sending the suitable LDPC codes to the base station or wireless router at step 508 and negotiating the suitable LDPC code to be used by base station or wireless router with each of the connected wireless device or mobile handset and switching to the suitable LDPC code if that particular wireless device or mobile handset agrees 510.

Figure 6:
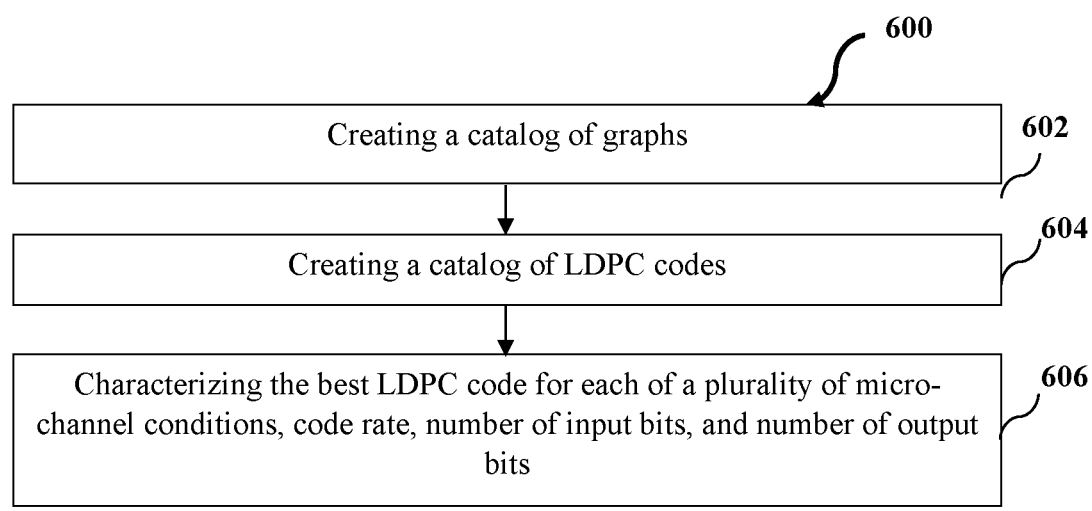
FIG. 6 illustrates a flowchart on the offline functionality of a cloud server, according to an embodiment herein.

FIG. 6 illustrates a flowchart on the offline functionality of a cloud server, according to an embodiment herein. FIG. 6 600 illustrates the step-by-step offline functionality of the cloud server. Every LDPC code can be considered to be created from a graph of high girth. The method 600 involves creating a catalog of graphs at step 602. The method 600 further involves creating a catalog of LDPC codes at step 604. In addition, the method 600 involves characterizing the suitable LDPC code for each of a plurality of micro-channel conditions, code rate, number of input bits, and number of output bits at step 606.

Figure 7:
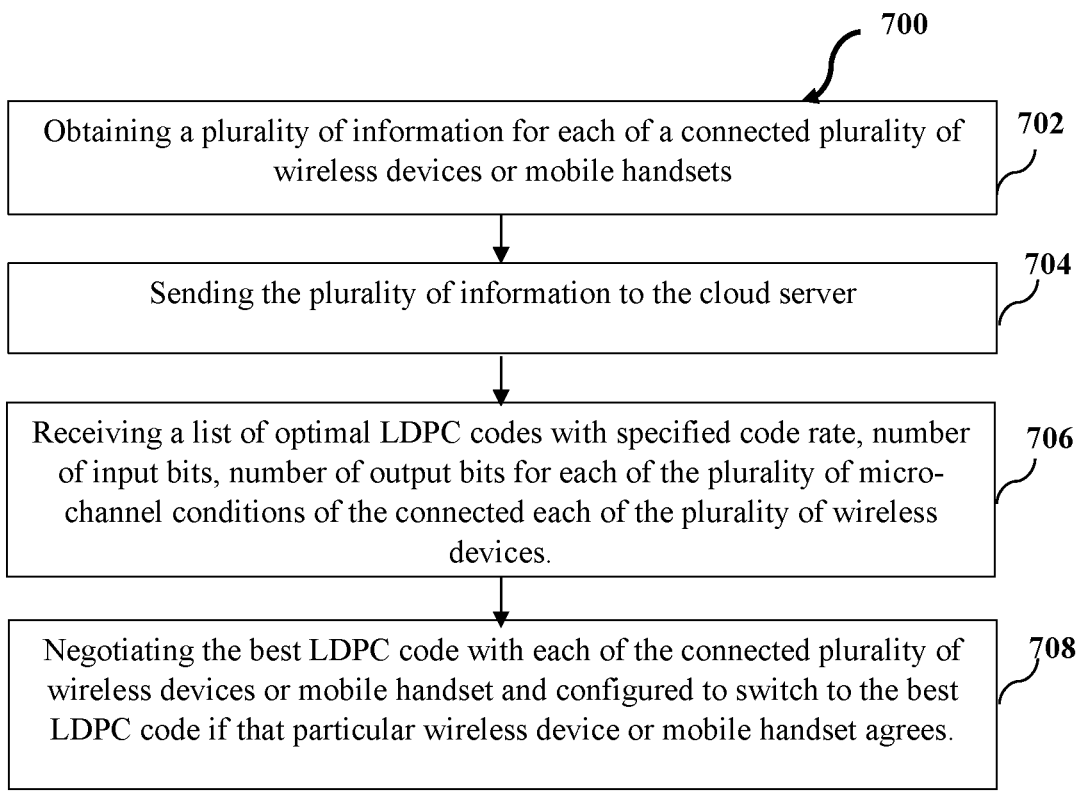
FIG. 7 illustrates a flowchart on method of functioning of a base station or wireless router, according to an embodiment herein.

FIG. 7 illustrates a flowchart on method of functioning of a base station or wireless router, according to an embodiment herein. The method 700 involves obtaining a plurality of information for each of a connected plurality of wireless devices or mobile handsets at step 702. The plurality of information includes micro-channel conditions, code rate, number of input bits, and number of output bits. Further, the method 700 involves sending the plurality of information to the cloud server at step 704. In addition, the method 700 involves receiving a list of optimal LDPC codes with specified code rate, number of input bits, number of output bits for each of the plurality of micro-channel conditions of the connected each of the plurality of wireless devices or mobile handsets at step 706. Furthermore, the method 700 involves negotiating the suitable LDPC code with each of the connected plurality of wireless devices or mobile handset, and configured to switch to the suitable LDPC code if that particular wireless device or mobile handset agrees at step 708.

Figure 8:
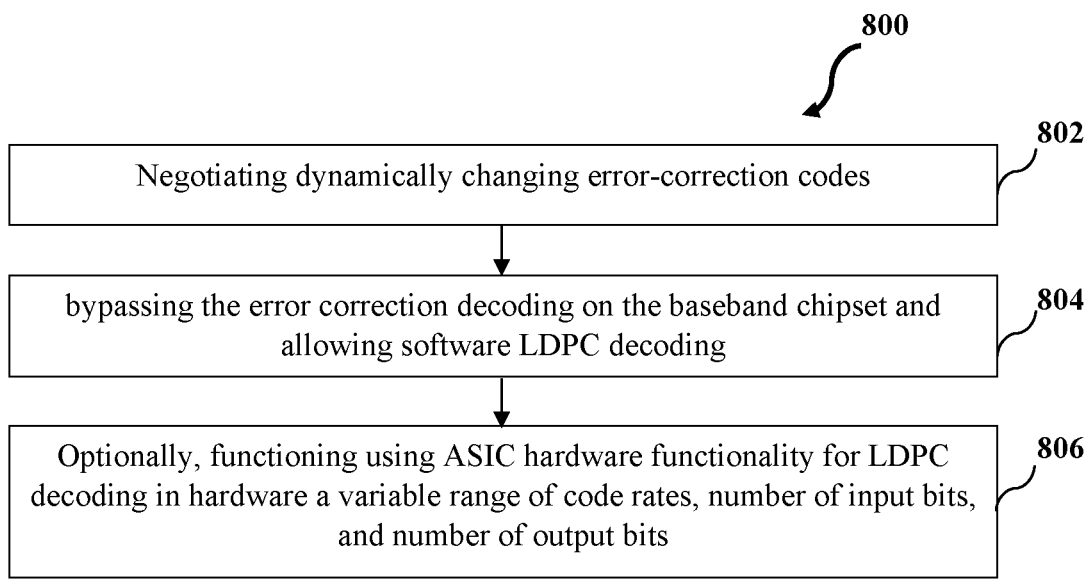
FIG. 8 illustrates the method of functioning of the plurality of wireless devices or mobile handsets, according to an embodiment herein.

FIG. 8 illustrates the method of functioning of the plurality of wireless devices or mobile handsets, according to an embodiment herein. The plurality of wireless devices or mobile handsets comprises a baseband chipset, an application, and optionally an application-specific integration circuit (ASIC). The plurality of wireless devices or mobile handsets operation is supported by both hardware functionality and software functionality. The plurality of wireless devices or mobile handsets comprising the application and baseband chipset works on software functionality. The method 800 involves negotiating dynamically changing error-correction codes at step 802. The negotiated/identified or selected LDPC code might not be adopted in some cases, wherein the software or the application on the mobile handset can choose not to switch to the new LDPC code. The method 800 further involves bypassing the error correction decoding on the baseband chipset and allowing software LDPC decoding at step 804. In addition, the method involves 800 the plurality of wireless devices or mobile handsets can also function using ASIC hardware functionality for LDPC decoding in hardware a variable range of code rates, number of input bits, and number of output bits at step 806. The ASIC hardware functionality if present in the plurality of wireless devices or mobile handsets work seamlessly with the software or the application and also the baseband chipset on. Furthermore, the presence of ASIC is entirely optional, as software LDPC decoding for dynamically changing codes is possible. Therefore, the plurality of wireless devices or mobile handsets having the application running, the LDPC decoding can happen either in software or an ASIC on the plurality of wireless devices or mobile handsets.

Figure 9:
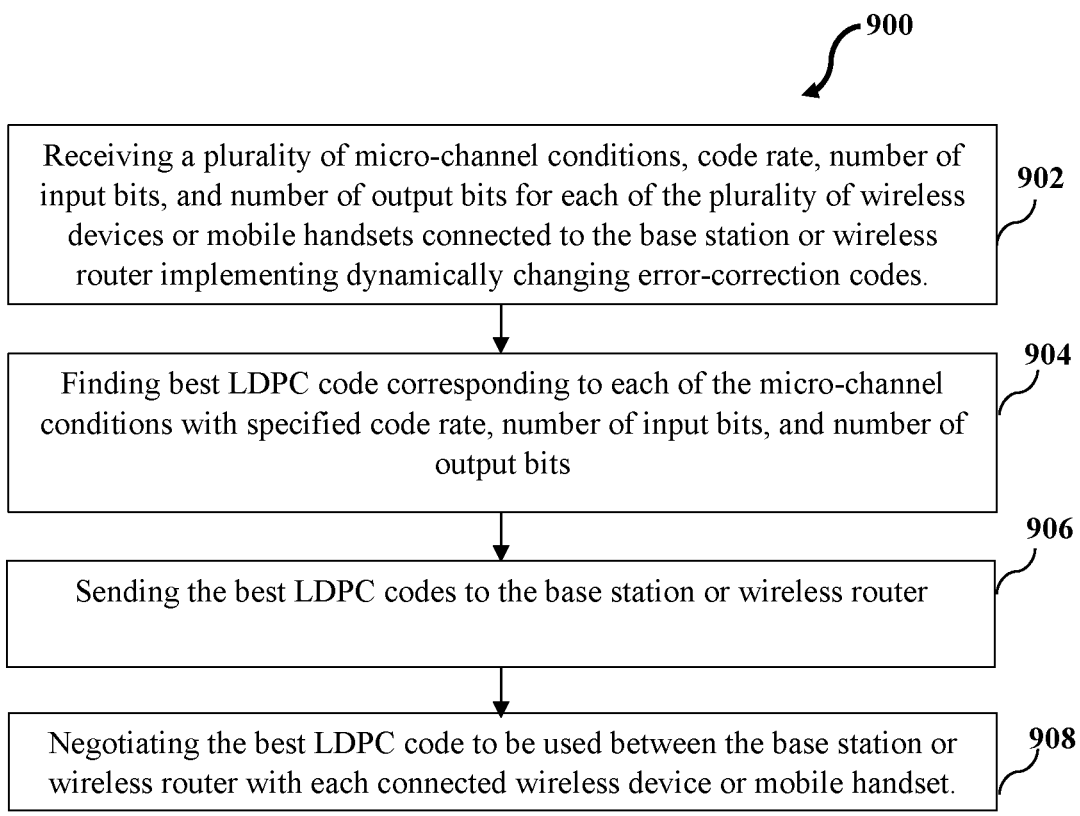
FIG. 9 illustrates a flowchart on online functionality of the cloud server with the base station or wireless router and the plurality of wireless devices or mobile handsets, according to an embodiment herein.

FIG. 9 illustrates a flowchart on online functionality of the cloud server with the base station or wireless router and the plurality of wireless devices or mobile handsets, according to an embodiment herein. When the base station or wireless router sends a list of micro-channel conditions, the cloud server sends an optimal LDPC code with specified code rate, number of input bits and number of output bits for each micro-channel condition in the list. FIG. 9 900 illustrates the overall interaction between the cloud server, base station or wireless router, and the plurality of wireless devices or mobile handsets. The method 900 involves receiving a plurality of micro-channel conditions, code rate, number of input bits, and number of output bits for each of the plurality of wireless devices or mobile handsets connected to the base station or wireless router implementing dynamically changing error-correction codes at step 902. The method 900 further involves finding suitable LDPC code corresponding to each of the micro-channel conditions with specified code rate, number of input bits, and number of output bits at step 904. The method 900 further involves sending the suitable LDPC codes to the base station or wireless router at step 906. In addition, the method 900 involves negotiating/selecting/identifying the suitable LDPC code to be used between the base station or wireless router with each connected wireless device or mobile handset at step 908.

It is also to be understood that various arrangements may be devised that, although not explicitly described or shown herein, embody the principles of the present disclosure. Moreover, all statements herein reciting principles, aspects, and embodiments of the present disclosure, as well as specific examples, are intended to encompass equivalents thereof.

While the disclosure is susceptible to various modifications and alternative forms, specific embodiment thereof has been shown by way of example in the drawings and will be described in detail above. It should be understood, however, that it is not intended to limit the disclosure to the forms disclosed, but on the contrary, the disclosure is to cover all modifications, equivalents, and alternatives falling within the scope of the disclosure.

Advantages of the Embodiments Herein

The embodiments herein disclose a system and method for the generation of error-correcting codes in communication systems. The embodiments herein utilizes dynamically changing error-correction codes in wireless communication systems. The embodiments herein generalizes the current method of selection of the error correction code to be used in wireless communication systems. The current approach is that each wireless standard defines a set of modulation constellations and error correction codes that can be used at the physical layer. While these embodiments herein could be deployed along with future wireless standards, they could also be used to work with existing standards by suitably modifying the error correction code used for better optimality and efficiency. Dynamically changing error-correction code makes using the suitable error-correction codes to be used as the channel conditions change with time with dramatically more flexibility than the correct approach in many wireless standards of switching the MCS index and consequently, the modulation scheme and error correction code used.

Since several wireless devices are likely to explode by the end of this decade especially due to the Internet of Things (IOT), and also applications are going to be more data-intensive, the primary objective of the embodiments herein is to enable efficiencies, better data speeds, and better user experiences in wireless communication systems, by going beyond conventional approaches. Even though new-generation wireless networks deliver a huge amount of data throughput compared with previous-generation technologies, there continue to be issues around the variability of the kind of data service available. Some of the continuing challenges for wireless would be to improve data speeds for signal weak spots and to increase the number of subscribers without a proportional increase in infrastructure investment. One way to achieve this is through an innovative approach of dynamically changing error correction codes that can potentially be used across the entire range of wireless communication standards. Mobile operators can utilize this efficient framework of dynamically changing error correction codes to achieve greater capacity and data rates.

In addition, the embodiments herein on the cloud finds the suitable modulation scheme and error correction code for channel conditions, wireless channels used, and wireless standard used. Therefore, the potential advantages include efficiencies of dynamically changing error-correction codes, potentially greater capacity, and increased data rate.

Although the embodiments herein are described with various specific embodiments, it will be obvious for a person skilled in the art to practice the embodiments herein with modifications.

The foregoing description of the specific embodiments will so fully reveal the general nature of the embodiments herein that others can, by applying current knowledge, readily modify and/or adapt for various applications such as specific embodiments without departing from the generic concept, and, therefore, such adaptations and modifications should and are intended to be comprehended within the meaning and range of equivalents of the disclosed embodiments.

It is to be understood that the phrases or terminology employed herein is for the purpose of description and not of limitation. Therefore, while the embodiments herein have been described in terms of preferred embodiments, those skilled in the art will recognize that the embodiments herein can be practiced with modifications. However, all such modifications are deemed to be within the scope of the claims.

What is claimed is:

1. A system comprising a hardware processor and a memory stored with a plurality of instructions that are run on the hardware processor for generating a catalog of LDPC codes through one or more application(s) or algorithm(s), for creating an error correction code(s) in a communication system(s), the system comprising:
   a user interface configured to receive a plurality of details of a graph system, and wherein the user interface is configured to receive the plurality of details of the graph parameters system through a computing device;
   the hardware processor coupled to the user interface for generating graphs based on a user input(s) using one or more applications or algorithms;
   a graph creation module loaded with an instruction(s) that are runs on the hardware processor and is configured to generate a (3, g) Hamiltonian Bipartite graph(s) of a specified even girth, and a graph(s) with a larger number of orders and a larger girth(s) through one or more applications or algorithms;
   a table creation module loaded with the instructions that are run on the hardware processor and configured to create a table of the (3, g) Hamiltonian Bipartite graphs for a symmetry factor b, for a different order(s) through the application or algorithm;
   a catalog creation module loaded with instructions that are run on the hardware processor and configured to generate a catalog of the (3, g) Hamiltonian Bipartite graphs including a plurality of tables of various orders through the application or algorithm;

an LDPC generation module loaded with instructions that are run on the hardware processor and configured to generates a catalog of LDPC codes from the catalog of the (3, g) Hamiltonian Bipartite graphs through the application or algorithm; and a database coupled to at least one of the graph creation modules, the table creation module, the catalog creation module, and the LDPC generation module, and are configured for storing a plurality of details of the graph system and the catalog of generated graphs, and the catalog of the LDPC codes;

wherein the graph creation module is further configured to generate a smallest known (3, g) graph for even a specified girth through the application or algorithm, and wherein the graph creation module is configured to generate a list of (3, g) graphs for an even a girth g to provide graphs that are not-vertex transitive for many orders through the application or algorithm, and wherein the hardware processor is configured for creation of the error-correction code(s) through an application or algorithm using the catalogue of (3, g) graph for the even girth g as a source, for correcting errors introduced during data transmission from a source to a receiver in a communication channel to enable delivery of a digital data over an unreliable communication channel(s) and to enable a reconstruction of an original data sent and wherein the error correction codes are implemented in the communication system(s) to remove an error(s) introduced during a transmission from a source to a receiver due to a channel noise;

a cloud server loaded with the graph creation module and configured to create a catalog of graphs; and wherein the cloud server is configured to create the catalog of LDPC codes, and wherein the cloud server is configured to identify or select the suitable LDPC code for each of a plurality of micro-channel conditions, a code rate, a number of input bits, and a number of output bits;

a base station or a wireless router configured to obtain a plurality of information for each of a connected wireless device or a mobile handset; and wherein the base station or the wireless router is configured to send the plurality of information to the cloud server;

and wherein the base station or the wireless router is configured to receive a list of optimal LDPC codes with specified the code rate, the number of input bits, the number of output bits for each of the a plurality of micro-channel conditions of the each connected wireless device or the mobile handset; and wherein the base station or the wireless router is configured to identify or select a suitable LDPC code for each of the connected wireless device or the mobile handset, and wherein the base station or the wireless router is configured to switch to the identified or selected LDPC code if the particular wireless device or the mobile handset; and wherein the base station or wireless router is configured to include a dynamically changing error correction into a wireless standard, to identify or select the suitable LDPC code for each connected wireless device or mobile handset;

wherein each wireless device or mobile handset comprises a baseband chipset, an application, and optionally an application-specific integration circuit (ASIC); and wherein each wireless device or mobile handset is configured to bypass an error correction decoding on the a baseband chipset and allow software LDPC decoding; and wherein each wireless device or mobile handset comprises optionally ASIC configured to allow LDPC decoding in a hardware for a variable range of code rates, the number of input bits, and the number of output bits;

wherein the cloud server is further configured to receive the plurality of micro-channel conditions, code rate, number of input bits, and number of output bits for each wireless device or mobile handset connected to the base station or wireless router which is configured to implement or do not implement a dynamically changing error-correction code(s); and wherein the cloud server is configured to find or select the suitable LDPC code corresponding to each of the plurality of micro-channel conditions with specified code rate, number of input bits, and number of output bits; and wherein the cloud server is configured to send the selected LDPC codes to the base station or wireless router; and wherein the cloud server is further configured to identify or select the suitable LDPC code to be used by the base station or wireless router for each connected wireless device or mobile handset; and wherein the cloud server is configured to identify or select the suitable LDPC code for communication of base station or wireless router with each connected wireless device or mobile handset when the dynamically changing error-correction code(s) is used with an existing wireless standard.

2. The system according to claim 1, wherein the graph generation module is further configured for representing an infinite family of Hamiltonian Bipartite graphs of regular degree with a D3 chord index notation through the application or algorithm.

3. The system according to claim 1, wherein the table creation module is configured to generate a table(s) including lists of the (3, g) Hamiltonian Bipartite graphs that are exhaustive with graphs for each order in specified range through an application or algorithm.

4. The system according to claim 1, wherein the plurality of information for each connected wireless device or mobile handset includes micro-channel conditions, code rate, number of input bits, and number of output bits.

5. The system according to claim 1, wherein the cloud server and the base station or wireless router are configured to interact between each other by:
a) sending the plurality of information by the base station or wireless router for each of the connected wireless device or the mobile handset to the cloud server;
b) sending the selected LDPC codes by the cloud server to the base station or wireless router;
c) identifying or selecting the suitable error-correction codes by the base station or wireless router based on the selected LDPC code with specified code rate, number of input bits, and number of output bits sent by the cloud server for each wireless device or mobile handset.

6. The system according to claim 1, wherein the base station or wireless router is configured to interact with each wireless device or mobile handset, when the base station or wireless router is configured to include the dynamically changing error-codes, by:
a) switching to a new LDPC code from the existing LDPC code, when the each wireless device or mobile handset agrees; or b) refusing to switch to the new LDPC code by the each wireless device, or mobile handset, if a sample decoding for the new LDPC code concludes that the computational resources available for decoding are insufficient; and c) repeating step a and step b at regular intervals of time to ensure that an optimal LDPC code is available for the plurality of micro-channel conditions.

7. The system according to claim 1, wherein the base station or wireless router is configured to interact with the wireless device or mobile handset, when the base station or wireless router fails to include the dynamically changing error-codes, by:

a) sending the plurality of information by the base station or wireless router for the connected wireless device or mobile handset to the cloud server;

b) sending the selected suitable LDPC codes by the cloud program to the base station or wireless router;

c) sending the selected LDPC codes with specified code rate, number of input bits, and number of output bits of the plurality of micro-channel conditions of the wireless device or mobile handset comprising running the application on the particular wireless device or mobile handsets via internet;

d) identifying or selecting the suitable error-correction codes by the base station or wireless router based on the selected LDPC code with specified code rate, number of input bits, and number of output bits sent by the cloud server for the wireless device or mobile handset; and e) switching to a new optimal LDPC code when the base station or wireless router and each of the connected wireless device or mobile handset agrees.

8. The system according to claim 1, wherein the base station or wireless router is further configured to interact with the wireless device or mobile handset, when the base station or wireless router fails to include the dynamically changing error-codes, by:

a) obtaining the suitable LDPC code with specified code rate, number of input bits and number of output bits for that micro-channel instance from the cloud server;

b) identifying or selecting a suitable LDPC code with specified code rate, number of input bits, and number of output bits for each of the plurality of micro-channel conditions for communication of the wireless devices or mobile handset connected to the base station;

c) switching to the a new optimal LDPC code when the base station or wireless router and the connected wireless device or mobile handset agrees.

9. The system according to claim 1, wherein the wireless devices or mobile handset comprises the application and ASIC, and wherein the LDPC decoding is performed using either the application or the ASIC.

10. A computer implemented method comprising instructions stored on a non-transitory computer-readable storage medium and executed on a computing device provided with a hardware processor and a memory for generating a catalog of LDPC codes through a one or more applications or algorithms, for creating an error correction code(s) in a communication system(s), the method comprising the steps of:

receiving a plurality of details of a graph through a user interface of the computing device, wherein a plurality of graph parameters are received through the computing device; generating a (3, g) Hamiltonian Bipartite graph(s) of a specified even girth, and graphs with a larger number of orders and larger girths through a graph creation module through one or more applications or algorithms;

generating a table of (3, g) Hamiltonian Bipartite graphs for a symmetry factor b, for different orders through a table creation module through an application or algorithm;

generating a catalog of (3, g) Hamiltonian Bipartite graphs including a plurality of tables for various orders through a catalog creation module through an application or algorithm;

generating a catalog of LDPC codes from a catalog of (3, g) Hamiltonian Bipartite graphs through of LDPC generation module through an application or algorithm; and storing a plurality of details of the graph system and the catalog of generated graphs, and the catalog of the LDPC codes in a database;

wherein the graph creation module is further configured to generate smallest known (3, g) graph for even a specified girth through an application or algorithm, and wherein the graph creation module is configured to generate a list of (3, g) graphs for an even a girth g to provide graphs that are not-vertex transitive for many orders through an application or algorithm, and wherein the catalogue of (3, g) graphs for the even girth g, is used as a source for creation of the error-correction codes by the hardware processor through an application or algorithm for a correcting errors introduced during data transmission from a source to a receiver in a communication channel to enable delivery of digital data over an unreliable communication channel(s) and to enable a reconstruction of original data sent, and wherein the error correction codes are implemented in the communication systems to remove the errors introduced during a transmission from a source to the receiver due to channel noise;

wherein the step of generating dynamically changing error-correcting codes in the communication systems, further comprising the steps of:

a) receiving a plurality of information for each of a plurality of wireless devices or mobile handsets connected to a base station or a wireless router by a cloud server (502);

b) creating a catalog of graphs, creating a catalog of LDPC codes, and characterizing the a suitable LDPC code for each of a plurality of a micro-channel condition(s), a code rate, a number of input bits, and a number of output bits (504);

c) finding the suitable LDPC code corresponding to each of the plurality of micro-channel conditions with the code rate, the number of input bits, and the number of output bits (506);

d) sending the suitable LDPC codes by the cloud server to the base station or the wireless router for each connected wireless devices or mobile handsets (508); and e) identifying the suitable LDPC code to be used between the base station or wireless router and each of the connected plurality of wireless devices or mobile handsets if both agrees (510).

11. The method according to claim 10, wherein the plurality of information for each of the connected plurality of wireless device or mobile handsets includes micro-channel conditions, code rate, number of input bits, and number of output bits.

* * * * *